United States Patent [19]

Baron

[11] Patent Number: 4,831,343
[45] Date of Patent: May 16, 1989

[54] CRYSTAL CLOCK GENERATOR HAVING FIFTY PERCENT DUTY CYCLE

[75] Inventor: Natan Baron, Oranti, Israel

[73] Assignee: Motorola, Inc., Schaumburg, Ill.

[21] Appl. No.: 172,517

[22] Filed: Mar. 24, 1988

[51] Int. Cl.$^4$ ............................................. H03B 5/36
[52] U.S. Cl. ............................... 331/116 R; 331/109; 331/116 FE
[58] Field of Search ............... 331/108 B, 109, 116 R, 331/116 FE, 135, 182, 183; 368/159

[56] References Cited

U.S. PATENT DOCUMENTS

| | | | |
|---|---|---|---|
| 3,725,822 | 4/1973 | Eaton, Jr. ........................ | 331/135 X |
| 3,979,693 | 9/1976 | Saari ............................ | 331/116 R X |
| 3,996,530 | 12/1976 | Feistel et al. ................... | 331/116 R |
| 4,536,721 | 8/1985 | Charbonnier .................... | 331/116 R |
| 4,570,132 | 2/1986 | Driscoll ........................ | 331/116 R X |
| 4,704,587 | 11/1987 | Ouyang et al. ................. | 331/116 FE |
| 4,710,730 | 12/1987 | Doyle, III ..................... | 331/116 FE |

*Primary Examiner*—Eugene R. LaRoche
*Assistant Examiner*—Robert J. Pascal
*Attorney, Agent, or Firm*—Robert L. King

[57] ABSTRACT

A crystal oscillator circuit having an accurate duty cycle at very high frequency is provided. An oscillator stage is provided which receives regenerative feedback from an inverter to sustain oscillation. The oscillator stage provides an AC output signal having a first average DC value determined by the regenerative feedback. The AC signal is coupled to a clipping circuit which symmetrically clips the AC signal about a predetermined second average DC level at first and second predetermined voltage levels. The inverter receives the clipped signal and provides an oscillating clock signal with an accurate duty cycle in response thereto.

12 Claims, 1 Drawing Sheet

CRYSTAL CLOCK GENERATOR HAVING FIFTY PERCENT DUTY CYCLE

TECHNICAL FIELD

This invention relates generally to the field of oscillators, and, in particular, to improvements in crystal-controlled clock generators having stringent duty cycle specifications.

BACKGROUND ART

As digital electronic circuits become increasingly faster in speed of operation, a need exists for a clock signal with an accurate fifty percent duty cycle for clocking data and for other purposes. Such clock signals are required at frequencies in a range of up to several hundred MHz. To obtain a clock signal with a precise and nonvariable frequency, others have typically used a crystal oscillator. In many digital circuits, such as microprocessors, a clock signal having a fifty percent duty cycle with less than a couple percent error is required. At high frequency, if the duty cycle is not extremely accurate, such as within a percent of fifty percent, circuit errors can be generated due to timing errors. Others have typically obtained an accurate fifty percent duty cycle by using a crystal having a frequency which is twice the frequency of the desired clock signal. A divide by two counter is used to divide the crystal's frequency to a frequency having a fifty percent duty cycle. Several disadvantages exist with this type of clock generator circuit. As a crystal's frequency is increased, so is the cost of the crystal if frequency accuracy is required. Therefore, when a clock frequency in the several hundred MHz range is desired, the use of an expensive crystal having twice the desired frequency typically becomes cost prohibitive. Further, the use of a high frequency signal is generally problematic. Others not using a double frequency oscillator typically reduce system frequency in order to meet a required duty cycle tolerance.

BRIEF DESCRIPTION OF THE INVENTION

Accordingly, an object of the present invention is to provide an improved crystal clock generator having a fifty percent duty cycle.

Another object of the present invention is to provide an improved clock generator having reduced circuit complexity and decreased manufacturing costs.

Yet another object of this invention is to provide an improved and simplified data clock oscillator which overcomes the aforementioned deficiencies.

In carrying out the above and other objects of the present invention, there is provided, in one form, a crystal clock generator circuit for providing an oscillating clock signal The clock generator circuit comprises an oscillator stage for generating an AC output signal. The oscillator stage includes a circuit portion for providing regenerative feedback to sustain oscillation and is adapted to receive a bias signal. The circuit portion provides the AC output signal having a duty cycle and a first average DC value determined by the bias signal. A clipping circuit is coupled to the AC output signal for clipping the AC output signal at first and second predetermined voltage levels symmetrical about a second average DC value. An amplifier is provided having an input coupled to the clipping circuit and has an output for providing the bias signal as the oscillating clock signal.

These and other objects, features and advantages will be more clearly understood from the following detailed description taken in conjunction with the accompanying drawings.

DETAILED DESCRIPTION OF THE INVENTION

Figure 1:
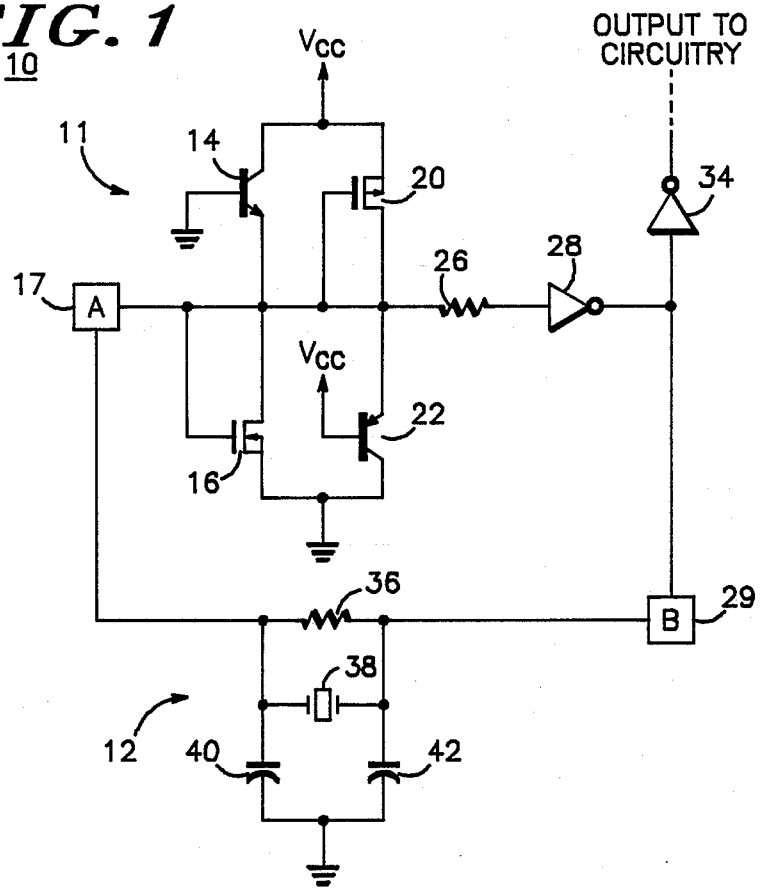
FIG. 1 illustrates in schematic form a crystal clock generator in accordance with the present invention.

The preferred embodiment of the invention, illustrated in FIG. 1, is a data clock generator 10 implemented in an integrated circuit (IC) which has two terminals or pins labeled "A" and "B". Generally, clock generator 10 is comprised of an internal circuit portion 11 which is internal to the IC and an external circuit portion 12 which is external to the IC. Although specific N-channel and P-channel MOS devices and bipolar devices are shown, it should be clear that clock generator circuit 10 may be implemented by completely reversing the processing techniques (e.g. N-channel to P-channel) or by using other types of transistors.

Internal circuit portion 11 comprises a bipolar transistor 14 having a collector connected to a power supply voltage terminal for receiving a positive power supply voltage $V_{CC}$. A base of transistor 14 is connected to a ground reference terminal. An emitter of transistor 14 is connected to a drain of an N-channel transistor 16 at pin A which is also labeled as a node 17. A gate of transistor 16 is also connected to node 17. A source of transistor 16 is connected to the ground reference terminal. A P-channel transistor 20 has a drain connected to the $V_{CC}$ power supply voltage terminal, and transistor 20 has both a gate and a source connected together to node 17. A bipolar transistor 22 has an emitter connected to node 17, a base connected to the terminal for receiving power supply voltage $V_{CC}$, and has a collector connected to the ground reference terminal. A resistor 26 has a first terminal connected to node 17 and has a second terminal connected to an input of an inverter 28. An output of inverter 28 is connected to both pin B which is further labeled as a node 29 and to an input of an inverter 34. An output of inverter 34 provides a clock signal having a fifty percent duty cycle which is coupled to additional circuitry not shown.

External circuit portion 12 comprises a resistor 36 having a first terminal connected to pin A or node 17, and has a second terminal connected to pin B or node 29. A quartz crystal 38 has a first terminal connected to pin A and has a second terminal connected to pin B. A capacitor 40 has a first electrode connected to pin A and has a second electrode connected to the ground reference terminal. A capacitor 42 has a first electrode connected to pin B and has a second electrode connected to the ground reference terminal.

In operation, circuit portion 12 functions in combination with inverter 28 to provide an oscillating input signal to inverter 34. Inverter 34 serves primarily as a buffer amplifier to interface with circuitry not shown which receives the generated clock signal. Inverter 34 has the same switchpoint voltage as inverter 28. Circuit portion 12 and inverter 28 function to create a 360° phase shift between the input and output of inverter 28. If the loop gain of the loop formed between pins A add B is greater than one, the output of inverter 28 oscillates. Crystal 38 functions in combination with capacitors 40 and 42 to provide a signal of very stable frequency. Resistor 36 functions as a feedback resistor for inverter 28 to create an inverting amplifier. The resistance of resistor 36 maintains the D.C. switchpoint of inverter 28 at the output of inverter 28 equal to the D.C. switchpoint at the input of inverter 28 and must be large enough not to affect the loop gain between the input and output of inverter 28.

When clock generator 10 is designed to have a fifty percent duty cycle, the switchpoint of inverter 28 must be equal to the D.C. voltage of the input sine wave provided by crystal 38. When implementing inverter 28, the switchpoint of inverter 28 is designed to be at exactly one-half the power supply voltage potential. However, in any production semiconductor process, the switchpoint of an inverter may vary over temperature and other parameters by as much as several tenths of a volt. As an example, if a five volt peak to peak sine wave is generated and the switchpoint of inverter 28 is actually 2.3 volts rather than 2.5 volts, the duty cycle is 47.5%, an error of 2.5%. For smaller amplitude clock signals, the error will be worse. In order to keep from making such variations affect the duty cycle of the output signal, a very large input sine wave signal is required. However, making the input signal have a large amplitude is not a sufficient solution to the stated problem. As the input clock signal amplitude is increased, the D.C. switchpoint of inverter 28 becomes sensitive and variable to a differential in potential between internal ground of the integrated circuitry and external ground. Any input protection circuit which may be provided for the integrated circuit may also add a significant D.C. bias to the input signal appearing at the input of inverter 28 should the input protection prevent the input signal from exceeding a predetermined maximum level and thereby distort the signal's symmetry.

As a solution to the above stated problems, the present invention avoids the problems associated with process and temperature variations of the switchpoint of inverter 28 by using the combination of transistors 14, 16, 20 and 22. Transistor 14 functions as a transistor clipping device in series with N-channel transistor 16 which provides input protection against high input voltages. Transistor 16 is diode configured by having the gate and drain connected together. In a preferred form, transistor 16 is implemented as a transistor commonly referred to as a "field" transistor having a threshold voltage of around fifteen volts. Therefore, transistor 16 is not conductive unless the input voltage reaches or exceeds fifteen volts. Once transistor 16 becomes conductive from an abnormally high input voltage, the input voltage is shunted to ground and away from inverters 28 and 34 and other circuitry. By having the base of transistor 14 connected to ground, transistor 14 becomes conductive once the input signal at pad A exceeds the voltage potential of $(Gnd - V_{be14})$ in a negative direction and clips the input signal to force the signal which is coupled to the input of inverter 28 to remain at $(Gnd - V_{be14})$, where $V_{be14}$ is the base-to-emitter voltage of transistor 14.

Concurrently, transistor 22 functions to clip any input signal coupled to pad A which exceeds a signal level equal to $(V_{CC} + V_{be22})$ where $V_{be22}$ is the base-to-emitter voltage of transistor 22. Since the base of transistor 22 is connected to power supply voltage $V_{CC}$, transistor 22 will remain nonconductive until the input signal reaches and goes above the voltage potential $(V_{CC} + V_{be22})$. In a preferred form, transistor 20 is also implemented as a field MOS transistor having a threshold voltage in the range of fifteen volts. Therefore, transistor 20 is nonconductive unless the input signal exceeds a value of approximately fifteen volts below ground. As a practical matter, transistor 20 provides a way to balance parasitic capacitances resulting from transistor 16 and is typically more useful for this purpose than as an input protection device.

Figure 2:
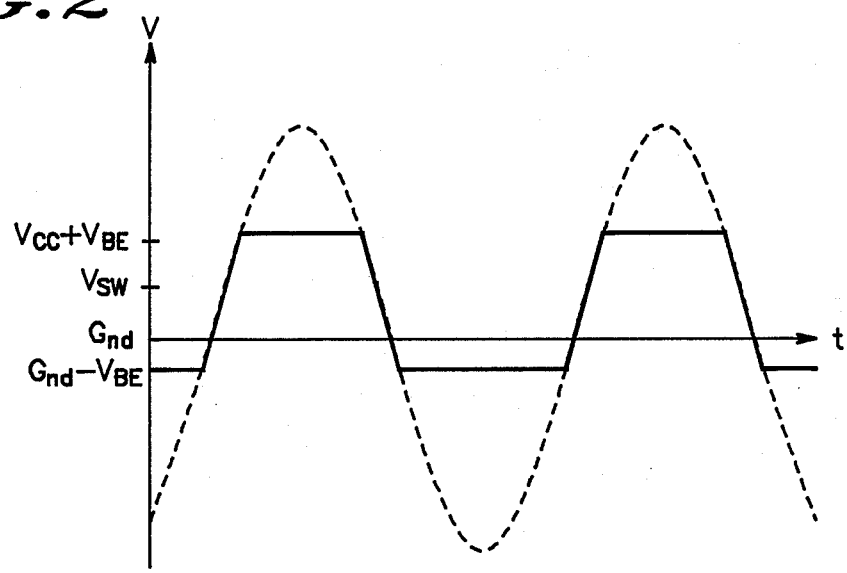
FIG. 2 illustrates in graphical form a waveform associated with the operation of the clock generator of FIG. 1.

Shown in FIG. 2 is a graphical illustration of the signals associated with clock generator 10 which provides an output signal (not shown) having a fifty percent duty cycle. A sinusoidal signal of amplitude sufficient enough to be clipped both in a positive and a negative direction is illustrated by a dashed line. The clipped signal is a substantially square wave signal illustrated with darker line detail. The output signal is not shown for purposes of drawing simplicity but is a substantially square wave signal with a fifty percent duty cycle which transitions between high and low voltage levels in response to the clipped signal transitioning at a switchpoint voltage, $V_{SW}$. As illustrated, the upper level of the clipped signal is $(V_{CC} + V_{be14})$ and the lower level of the clipped signal is $(Gnd - V_{be22})$. Since the base-to-emitter voltages of transistors 14 and 22 is a very constant voltage, the sinusoidal clock signal is clipped at a ground voltage internal to the I.C. and at the power supply voltage $V_{CC}$ internal to the I.C.. As a result, the switchpoint voltage, $V_{SW}$, or midpoint of the clipped signal is accurately set at $(V_{CC}/2)$. By using a sufficiently large loop gain, signal clipping in both the positive and negative direction may be ensured. At higher frequencies in the MHz range, the signal illustrated in FIG. 2 becomes more of a square wave clock signal because the side edges become more vertical. Since a symmetrical clock signal having an accurate switchpoint voltage is provided as a result of the symmetrical voltage clipping, the accuracy of the switchpoint of inverter 28 is minimized for purposes of obtaining a fifty percent duty cycle. At high frequencies, a substantially fifty percent duty cycle results even though inverter 28 does not transition logic states at exactly the $V_{SW}$ voltage level.

In the illustrated form, resistor 26 is connected between pin A and the input of inverter 28. Resistor 26 provides input protection in addition to that provided by transistors 14 and 16 by limiting input current which is coupled to inverters 28 and 34 by extremely high input signals which are inadvertently coupled to pin A. For purposes of implementing the present invention, resistor 26 is not required but is illustrated for the stated purpose.

By now it should be apparent that a clock generator circuit has been provided for high frequency applications where an accurate duty cycle is necessary. The clock generator circuit taught herein has low process and power supply voltage dependency and may operate accurately over a wide range of temperatures. The concept of the present invention may be readily extended to other types of external resonant oscillator structures in addition to the external structure illustrated in FIG. 1 coupled to pins A and B.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A crystal clock generator circuit for providing an oscillating clock signal, for use with an oscillator stage for generating an AC output signal, said oscillator stage including circuit means for providing regenerative feedback to sustain oscillation, said oscillator stage adapted to receive a bias signal and provide said AC output signal having a duty cycle and a first average DC value determined by the bias signal, said generator circuit comprising:

clipping means coupled to the AC output signal for clipping the AC output signal at first and second predetermined voltage levels symmetrical about a second average DC value, said clipping means comprising a first transistor having a first current electrode coupled to a terminal for receiving a power supply voltage, a control electrode coupled to a voltage reference terminal and a second current electrode coupled to the AC output signal, and a second transistor having a first current electrode coupled to the second current electrode of the first transistor, a control electrode coupled to the terminal for receiving the power supply voltage, and having a second current electrode coupled to the reference voltage terminal; and amplifier means having an input coupled to the clipping means and having an output for providing the bias signal as the oscillating clock signal.

2. The clock generator circuit of claim 1 further comprising:

input protection means coupled to the clipping means and the amplifier means, for limiting the AC output signal's magnitude from exceeding predetermined current and voltage value.

3. The clock generator circuit of claim 2 wherein the input protection means further comprise:

a third transistor having a first current electrode coupled to the voltage reference terminal, and having a control electrode and a second current electrode connected together and coupled to the AC output signal;

a fourth transistor having a first current electrode and a control electrode connected together and coupled to the AC output signal, and having a second current electrode coupled to the terminal for receiving the power supply voltage; and a resistor having a first terminal coupled to the second current electrode of the third transistor, and having a second terminal coupled to the input of the amplifier means.

4. The clock generator circuit of claim 3 wherein the first and second transistors of the clipping means are bipolar transistors and the third and fourth transistors of the input protection means are MOS transistors.

5. The clock generator circuit of claim 1 wherein the amplifier means further comprise:

an inverter circuit.

6. A crystal clock generator circuit for providing an oscillating clock signal, comprising:

an oscillator stage for generating an AC output signal, said oscillator stage including circuit means for providing regenerative feedback to sustain oscillation, said oscillator stage adapted to receive a bias signal and provide said AC output signal having a duty cycle and a first average DC value determined by the bias signal;

a first transistor having a first current electrode coupled to a power supply terminal for receiving a power supply voltage, a control electrode coupled to a reference voltage terminal, and a second current electrode coupled to the AC output signal of the oscillator stage;

a second transistor having a first current electrode connected to a control electrode thereof and coupled to the second current electrode of the first transistor, and a second current electrode coupled to the reference voltage terminal;

a third transistor having a first current electrode coupled to the power supply terminal for receiving the power supply voltage, a control electrode connected to a second current electrode thereof and coupled to the second current electrode of the first transistor;

a fourth transistor having a first current electrode coupled to the second current electrode of the third transistor, a control electrode coupled to the power supply terminal for receiving the power supply voltage, and a second current electrode; and amplifier means having an input coupled to the second current electrode of the third transistor, and having an output for providing the bias signal as the oscillating clock signal.

7. The crystal clock generator circuit of claim 6 further comprising:

a resistor having a first terminal coupled to the second current electrode of the third transistor, and having a second terminal coupled to the input of the amplifier means.

8. The crystal clock generator circuit of claim 6 further comprising:

a buffer circuit having an input coupled to the output of the amplifier means, and having an output for providing the oscillating clock signal.

9. The crystal clock generator circuit of claim 6 wherein the oscillator stage further comprises:

a resistor having a first terminal coupled to the output of the amplifier means, and a second terminal coupled to the second current electrode of the first transistor;

a crystal having a first terminal coupled to the first terminal of the resistor, and having a second terminal coupled to the second terminal of the resistor;

a first capacitor having a first electrode coupled to the first terminal of the crystal, and having a second electrode coupled to the reference voltage terminal; and a second capacitor having a first electrode coupled to the second terminal of the crystal, and having a second electrode coupled to the reference voltage terminal.

10. A crystal clock generator circuit comprising:

an amplifier having an input, and having an output for providing an oscillating clock signal;

a feedback resistor having a first terminal coupled to the output of the amplifier, and having a second terminal;

a crystal having a first terminal coupled to the first terminal of the feedback resistor and having a second terminal coupled to the second terminal of the feedback resistor;

a first capacitor having a first electrode coupled to the first terminal of the crystal, and having a second electrode coupled to a reference voltage terminal;

a second capacitor having a first electrode coupled to the second terminal of the crystal, and having a second electrode coupled to the reference voltage terminal;

a first bipolar transistor having a collector coupled to a power supply terminal, a base coupled to the reference voltage terminal, and an emitter coupled to the second terminal of the feedback resistor;

a first MOS transistor of a first conductivity type having a first current electrode and a control electrode connected together and coupled to the emitter of the first bipolar transistor, and having a second current electrode coupled to the reference voltage terminal;

a second MOS transistor of a second conductivity type having a first current electrode coupled to the power supply terminal, and having a control electrode and a second current electrode connected together and coupled to the second terminal of the feedback resistor;

a second bipolar transistor having an emitter coupled to the second current electrode of the second MOS transistor, a base coupled to the power supply terminal, and a collector coupled to the reference voltage terminal; and an input protection resistor having a first terminal coupled to the second current electrode of the second MOS transistor, and having a second terminal coupled to the input of the amplifier.

11. The crystal clock generator circuit of claim 10 further comprising:

a buffer circuit having an input coupled to the output of the amplifier, and having an output for providing the oscillating clock signal in a buffered form.

12. The crystal clock generator circuit of claim 10 wherein the first conductivity type is an N conductivity, and the second conductivity type is a P conductivity.

* * * * *